(12) United States Patent
Ohsawa et al.

(10) Patent No.: US 9,049,789 B2
(45) Date of Patent: Jun. 2, 2015

(54) MOUNTING ADAPTER, PRINTED BOARD, AND MANUFACTURING METHOD THEREOF

(71) Applicant: Fujitsu Limited, Kawasaki-shi, Kanagawa (JP)

(72) Inventors: Satoshi Ohsawa, Kawasaki (JP); Akira Tamura, Yokohama (JP)

(73) Assignee: FUJITSU LIMITED, Kawaskai (JP)

( * ) Notice: Subject to any disclaimer, the term of this patent is extended or adjusted under 35 U.S.C. 154(b) by 150 days.

(21) Appl. No.: 13/845,243

(22) Filed: Mar. 18, 2013

(65) Prior Publication Data

US 2013/0256005 A1    Oct. 3, 2013

(30) Foreign Application Priority Data

Mar. 28, 2012 (JP) ................................ 2012-074351

(51) Int. Cl.
| | |
|---|---|
| *H01R 12/00* | (2006.01) |
| *H05K 1/00* | (2006.01) |
| *H05K 1/02* | (2006.01) |
| *H05K 1/03* | (2006.01) |
| *H05K 1/18* | (2006.01) |
| *H05K 7/10* | (2006.01) |
| *H05K 3/32* | (2006.01) |
| *H05K 1/11* | (2006.01) |
| *H05K 1/14* | (2006.01) |

(52) U.S. Cl.
CPC ............ *H05K 1/0296* (2013.01); *H05K 1/0313* (2013.01); *H05K 1/0277* (2013.01); *H05K 1/181* (2013.01); *H05K 3/32* (2013.01); *Y10T 29/4913* (2013.01); *H05K 1/113* (2013.01); *H05K 1/141* (2013.01); *H05K 7/10* (2013.01); *H05K 7/1053* (2013.01); *H05K 2201/10378* (2013.01)

(58) Field of Classification Search
CPC ............................ H01R 23/722; H05K 7/1084
USPC .......................................... 439/66, 91, 70, 71
See application file for complete search history.

(56) References Cited

U.S. PATENT DOCUMENTS

| | | | | | |
|---|---|---|---|---|---|
| 5,716,222 | A | * | 2/1998 | Murphy | 439/91 |
| 6,050,832 | A | * | 4/2000 | Lee et al. | 439/91 |
| 6,062,873 | A | * | 5/2000 | Kato | 439/71 |
| 6,332,270 | B2 | * | 12/2001 | Beaman et al. | 29/844 |
| 7,131,847 | B2 | * | 11/2006 | Lee | 439/66 |
| 2002/0022383 | A1 | * | 2/2002 | Sakata et al. | 439/66 |
| 2005/0221635 | A1 | | 10/2005 | Brody et al. | |
| 2006/0244111 | A1 | | 11/2006 | Kuwahara | |
| 2007/0281516 | A1 | * | 12/2007 | Yamada et al. | 439/91 |
| 2011/0223780 | A1 | * | 9/2011 | Russell | 439/66 |

FOREIGN PATENT DOCUMENTS

| | | |
|---|---|---|
| JP | 06349557 | 12/1994 |
| JP | 09035789 | 2/1997 |

(Continued)

*Primary Examiner* — Hae Moon Hyeon
(74) *Attorney, Agent, or Firm* — Squire Patton Boggs (US) LLP

(57) ABSTRACT

There is provided a mounting adapter to be disposed between a socket and an electronic component when the electronic component is mounted with the socket. The mounting adapter includes a base having insulating property, a first electrode provided on a first surface of the base, the first surface facing the electronic component, the first electrode being to be in contact with an electric pad of the electronic component, a second electrode provided on a second surface of the base, the second electrode facing the socket, the second electrode being to be in contact with a conductor of the socket, and a through via that penetrates through the base and electrically connects the first electrode and the second electrode.

15 Claims, 12 Drawing Sheets

(56) References Cited

FOREIGN PATENT DOCUMENTS

| | | |
|---|---|---|
| JP | 2001-308302 | 11/2001 |
| JP | 2004-519822 | 7/2004 |
| JP | 2005-286331 | 10/2005 |
| JP | 2006-310140 A | 11/2006 |
| JP | 2008-277660 | 11/2008 |
| WO | 02/069454 A1 | 9/2002 |

* cited by examiner

MOUNTING ADAPTER, PRINTED BOARD, AND MANUFACTURING METHOD THEREOF

CROSS-REFERENCE TO RELATED APPLICATION

This application is based upon and claims the benefit of priority of the prior Japanese Patent Application No. 2012-074351, filed on Mar. 28, 2012, the entire contents of which are incorporated herein by reference.

FIELD

The embodiments discussed herein are related to a mounting adapter, a printed board, and a manufacturing method thereof.

BACKGROUND

In the case of mounting an electronic component such as an LGA (land grid array) packaged component onto a mounting board such as a system board, when removal of the electronic component is likely to be performed, the electronic component may be mounted on the mounting board with a socket interposed therebetween. The socket includes a number of conductors that electrically connect pads of the mounting board to pads of the electronic component. Upon mounting the electronic component, it is important to reliably bring these conductors into contact with the respective pads.

In recent years, application of such a socket to various types of electronic components has been discussed. For example, mounting a BGA (ball grid array) packaged component using a socket designed for LGA packaged components has been studied.

Examples of the related art are disclosed in Japanese Laid-open Patent Publication No. 6-349557, No. 9-35789, No. 2005-286331, No. 2001-308302, and No. 2008-277660, and Japanese National Publication of International Patent Application No. 2004-519822.

SUMMARY

According to an aspect of the invention, a mounting adapter to be disposed between a socket and an electronic component when the electronic component is mounted with the socket, the mounting adapter includes a base having insulating property, a first electrode provided on a first surface of the base, the first surface facing the electronic component, the first electrode being to be in contact with an electric pad of the electronic component, a second electrode provided on a second surface of the base, the second electrode facing the socket, the second electrode being to be in contact with a conductor of the socket, and a through via that penetrates through the base and electrically connects the first electrode and the second electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the case where a socket designed for LGA packaged components is used for mounting a BGA packaged component, even when the BGA packaged component has the same pad layout as the LGA packaged components, conduction might not be established between the BGA packaged component and the socket. Such a difficulty in establishing conduction is encountered not only in the case of LGA packaged components and BGA packaged components, but also in the case of other types of electronic components.

The embodiments aim to provide a mounting adapter capable of establishing conduction between an electronic component and a socket even when the socket is designed for electronic components of another type; a printed board; and a manufacturing method thereof.

Figure 1A:
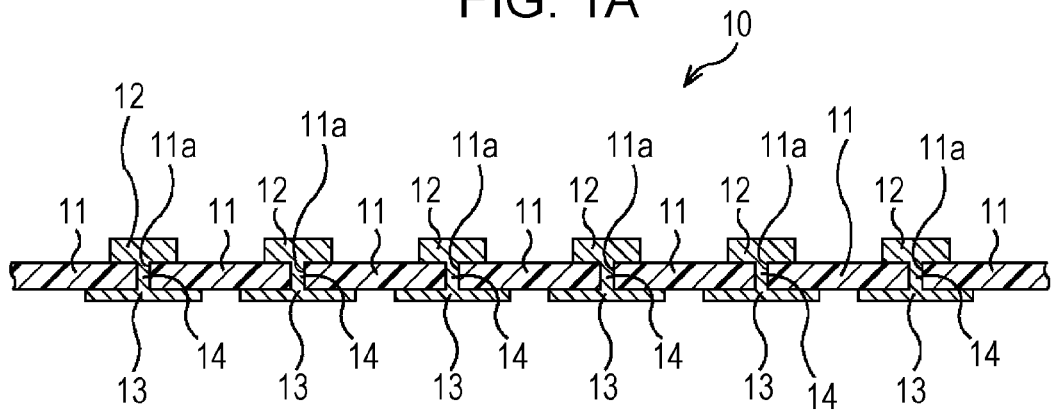
FIGS. 1A through 1C illustrate the structure of a mounting adapter according to an embodiment.
Figure 1B:
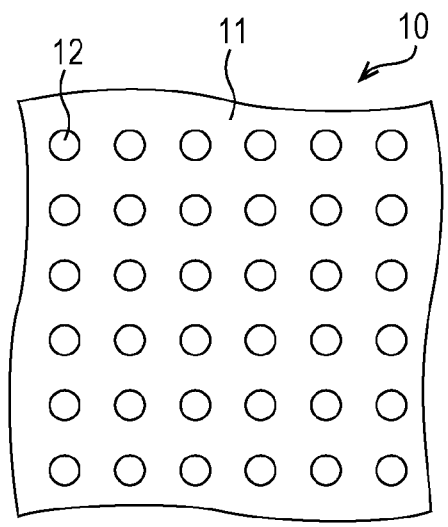
Figure 1C:
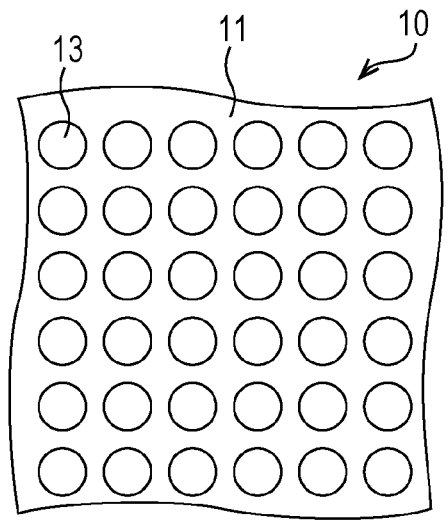

Hereinafter, embodiments are described in detail with reference to the accompanying drawings. A mounting adapter according to an embodiment is used so as to be interposed between a socket, which is designed to mount an electronic component of a first type (e.g., LGA-packaged component), and an electronic component of a second type (e.g., BGA-packaged component) having pads (electric pads) that are arranged in the same layout as those of the electronic component of the first type, for example. FIGS. 1A through 1C illustrate the structure of a mounting adapter 10 according to this embodiment. FIG. 1A is a cross-sectional view; FIG. 1B is a plan view of an electronic component side; and FIG. 1C is a plan view of a socket side.

As illustrated in FIGS. 1A through 1C, the mounting adapter 10 according to this embodiment includes a base 11 which is a film-like and includes a plurality of via holes 11a formed therein. Conductive through vias 14 are disposed in the respective via holes 11a. A plurality of component-side electrodes 12 that are conductive to the respective through vias 14 are provided on a surface of the base 11 at an electronic component side, while a plurality of socket-side electrodes 13 that are conductive to the respective through vias 14 are provided on a surface of the base 11 at a socket side. The component-side electrodes 12 are formed so as to be in contact with respective pads of an electronic component, while the socket-side electrodes 13 are formed so as to be in contact with respective conductors of a socket. The component-side electrode 12 is an example of a first electrode, and the socket-side electrode 13 is an example of a second electrode.

Figure 2A:
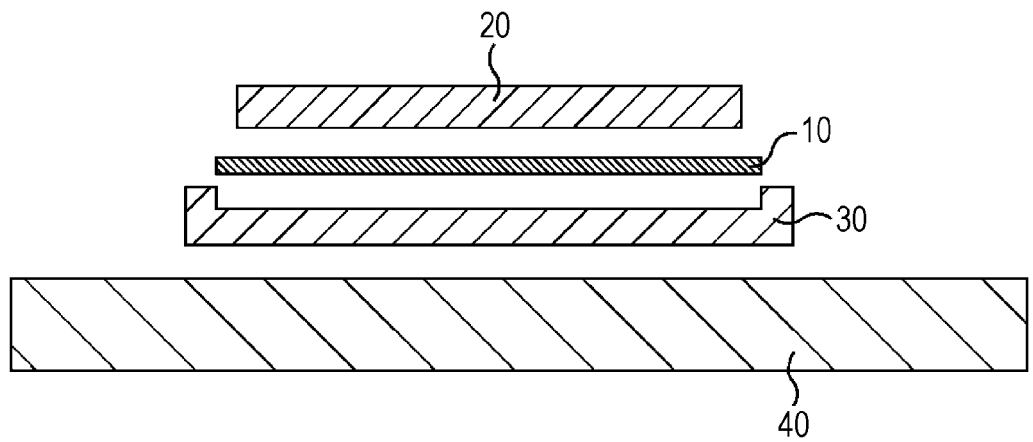
FIGS. 2A and 2B illustrate how the mounting adapter is used.
Figure 2B:
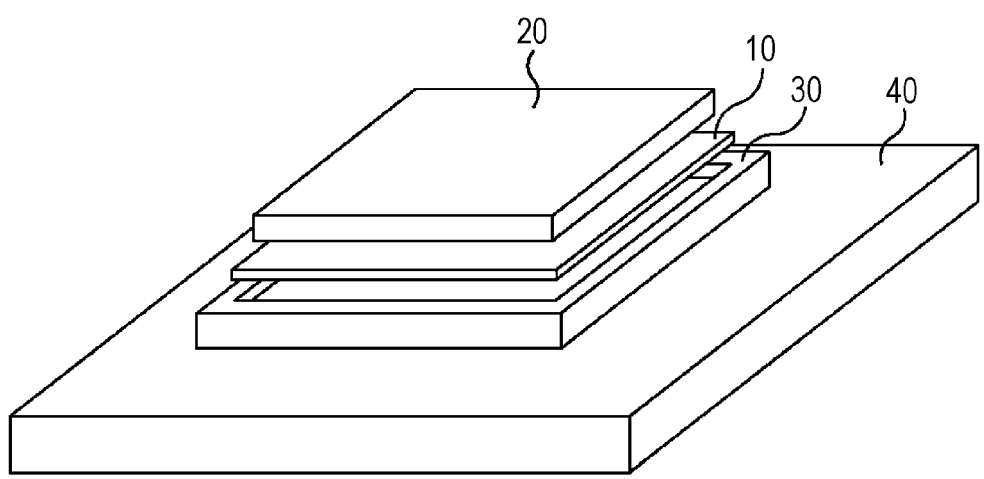

As illustrated in FIGS. 2A and 2B, when mounting an electronic component 20 (e.g., BGA packaged component) on a mounting board 40 with a socket 30 interposed therebetween, the mounting adapter 10 is disposed between the electronic component 20 and the socket 30. FIG. 2A is a cross-sectional view, and FIG. 2B is a perspective view when the mounting adaptor 10 is mounted. The socket 30 is designed to mount an electronic component of another type (e.g., LGA packaged component) having pads that are arranged in the same layout as those of the electronic component 20 (e.g., BGA packaged component). It is easy to establish conduction between the socket 30 and the electronic component of the other type (e.g., LGA packaged component).

Figure 3:
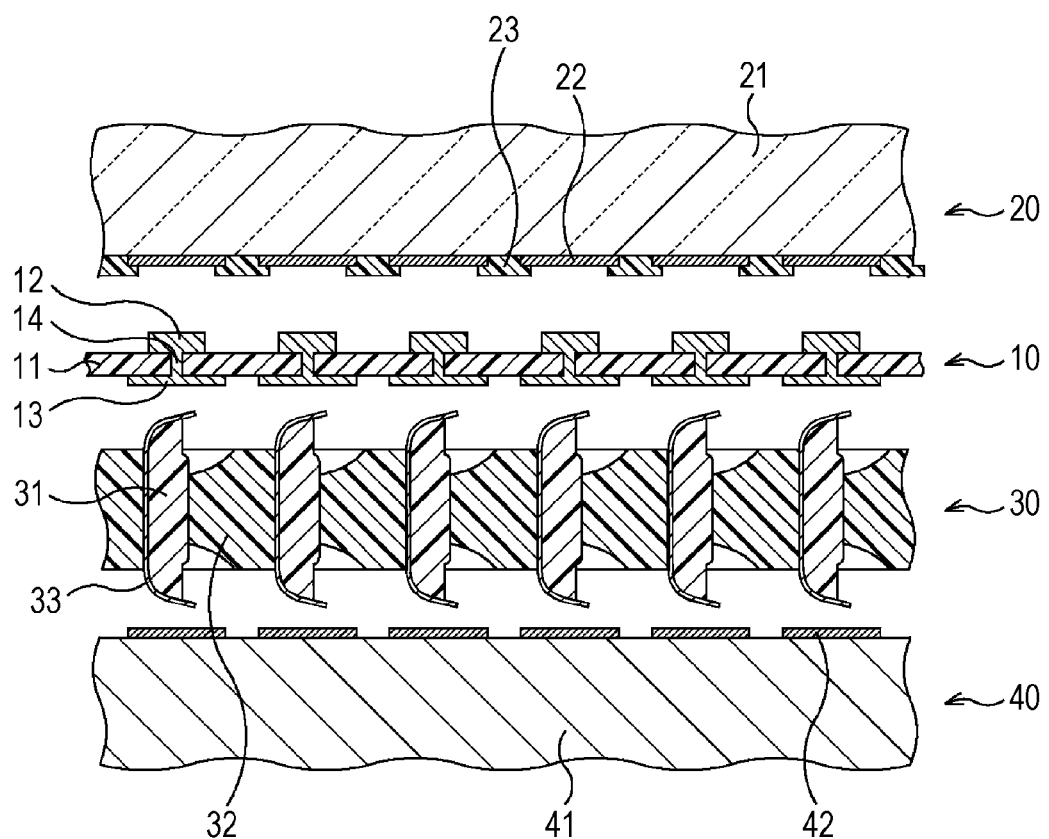
FIG. 3 illustrates how the mounting adapter is used.

More specifically, as illustrated in FIG. 3, the mounting board 40 includes a base 41 and pads 42. The socket 30 includes molded portions 32, elastic bodies 31, and conductive films 33. Further, the electronic component 20 includes a base 21, pads 22, and a resist material 23. The materials of these elements are not particularly limited. For example, the elastic body 31 may be made of silicone rubber, and the conductive film 33 may have a layered structure including a Cu film with a thickness of 3 μm through 6 μm, a Ni film with a thickness of 0.3 μm through 1 μm, and an Au film with a thickness of 0.3 μm or greater. Further, the base 21 may be made of an organic material such as glass epoxy, and the resist material 23 may be a common solder resist, for example. Furthermore, the periphery of the surface of each pad 22 is covered with the resist material 23, and the thickness of the resist material 23 covering the pad 22 is about 25 μm, for example. The reason why the periphery of the surface of the pad 22 is covered with the resist material 23 is to reduce the risk of the pad 22 coming off. Further, the base 11 may be made of a flexible material such as a polyimide film, for example. The base 11 may be made of an insulating material such as organic resin, for instance, and may have a thickness of about 25 μm. The thickness of each component-side electrode 12 is greater than the level difference between the resist material 23 and the pad 22, and is about 45 μm, for example. The thickness of each socket-side electrode 13 is about 5 μm. The component-side electrode 12 may preferably be thicker than the socket-side electrode 13. The component-side electrode 12 has a circular shape in plan view, for example, and the size thereof is less than that of the portion of the pad 22 exposed from the resist material 23. The diameter of the component-side electrode 12 is greater than that of the through via 14. The socket-side electrode 13 also has a circular shape in plan view, for example, and the size thereof is greater than that of the component-side electrode 12.

Figure 4:
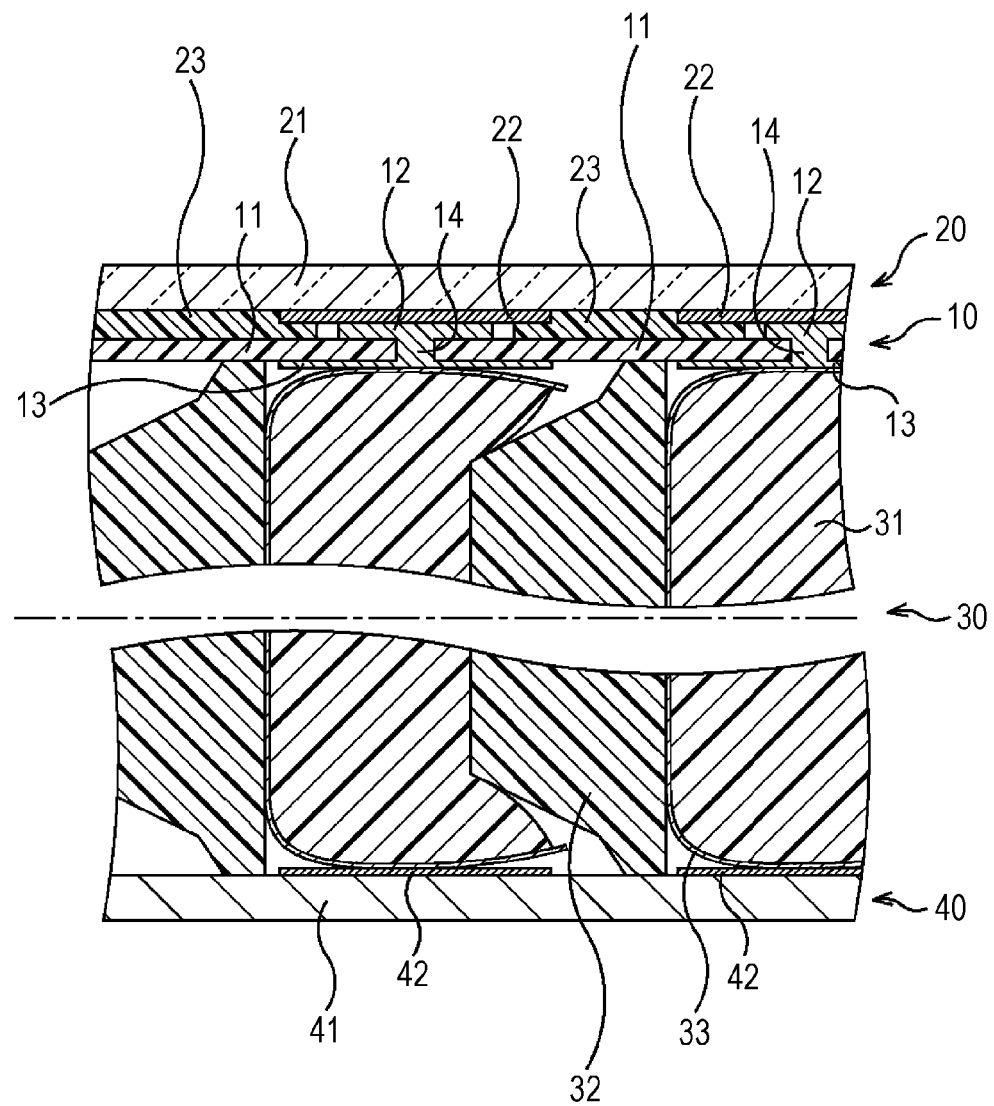
FIG. 4 illustrates a mounted state using the mounting adapter.

Upon mounting the electronic component 20, the mounting adapter 10 is attached to the electronic component 20 in advance such that the component-side electrodes 12 face the respective pads 22, for example. At this point, the component-side electrodes 12 do not have to be positively brought into contact with the pads 22. After that, the electronic component 20 is pressed against the mounting board 40 with the socket 30. Thus, as illustrated in FIG. 4, the elastic bodies 31 are deformed, and therefore the conductive films 33 are deformed so as to conform to the surfaces of the respective socket-side electrodes 13. Accordingly, the socket-side electrodes 13 come into contact with the conductive films 33 serving as conductors of the socket 30. Further, a force toward the electronic component 20 is applied to the mounting adapter 10 from the socket 30, in particular from the elastic bodies 31. As a result, even in the case where the component-side electrodes 12 were not brought into contact with the pads 22 when the mounting adapter 10 was attached to the electronic component 20, the component-side electrodes 12 come into contact with the pads 22. Since the component-side electrodes 12 and the socket-side electrodes 13 are conductive to each other through the through vias 14, conduction is established between the pads 22 and the conductive films 33.

According to this embodiment, even in the case where the socket 30 is not designed to mount the electronic component 20, it is possible to reliably establish conduction between the electronic component 20 and the socket 30. For example, even in the case where the socket 30 is designed to mount an LGA packaged component and where a BGA packaged component is used as the electronic component 20, as long as the LGA packaged component and the BGA packaged component have the same layout of pads, it is possible to establish conduction between the electronic component 20 and the socket 30. Accordingly, the socket 30 may be used for mounting a BGA packaged component without making any change to the socket 30. As a result of such mounting, a printed board including the mounting adapter 10, the electronic component 20, the socket 30, and the mounting board 40 is obtained.

Figure 5:
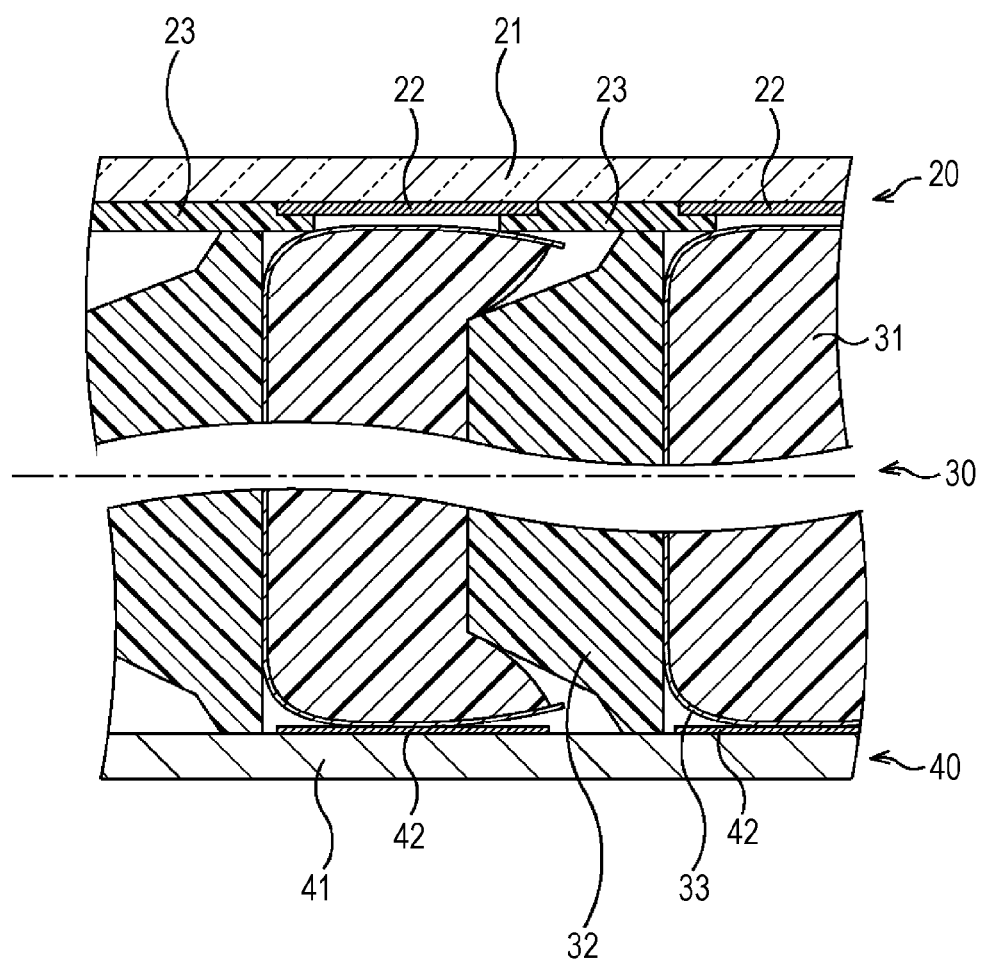
FIG. 5 illustrates a mounted state without using a mounting adapter.

It is to be noted that, as illustrated in FIG. 5, in the case where the mounting adapter 10 is not used, although the conductive film 33 is deformed in accordance with the deformation of the elastic body 31, since the socket 30 is not designed to mount the electronic component 20, the conductive film 33 might be deformed so as to conform to the edge of the resist material 23 depending on the thickness of the resist material 23. In this case, although the conductive film 33 is in contact with the edge of the resist material 23, there is a gap between the conductive film 33 and the pad 22, which may result in failing to establish conduction.

In this embodiment, since the through via 14 extends in a direction parallel to a thickness direction of the base 11, it is possible to reduce extension of the transmission path between the pad 22 of the electronic component 20 and the conductive film 33 of the socket 30. Accordingly, it is possible to minimize adverse effects on high-speed transmission.

Next, a description will be given of a method of manufacturing a mounting adapter according to an embodiment. FIGS. 6A through 6F sequentially illustrate a method of manufacturing a mounting adapter according to an embodiment.

Figure 6A:
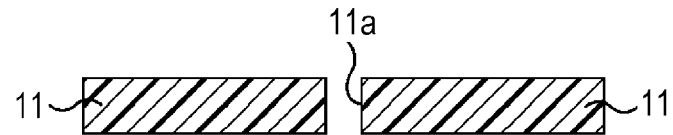
FIGS. 6A through 6F sequentially illustrate a method of manufacturing a mounting adapter according to an embodiment.
Figure 6B:
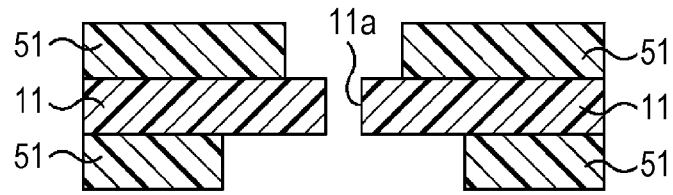
Figure 6C:
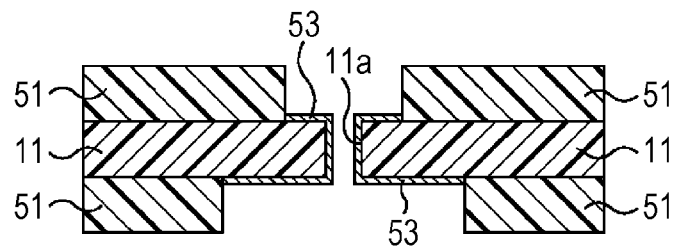
Figure 6D:
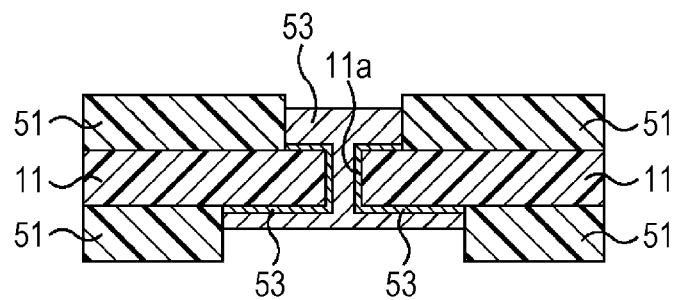
Figure 6E:
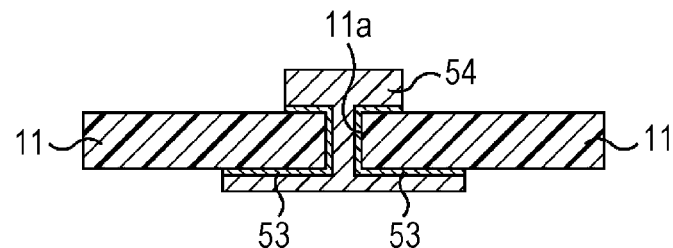
Figure 6F:
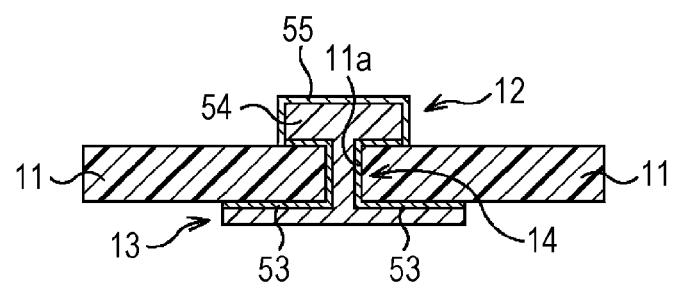

First, as illustrated in FIG. 6A, a via hole 11a is formed in a base 11. Then, as illustrated in FIG. 6B, resist patterns 51 are formed on both surfaces of the base 11 so as to expose the area where a component-side electrode 12 is to be formed and the area where a socket-side electrode 13 is to be formed while covering the other area. After that, as illustrated in FIG. 6C, a seed layer 53 is formed on a portion of the base 11 exposed from the resist patterns 51. The seed layer 53 may be a Cu layer formed by sputtering, for example. Subsequently, as illustrated in FIG. 6D, a plating film 54 is formed on the seed layer 53. The plating film 54 may be a Cu film formed by electrolytic plating, for example. Then, as illustrated in FIG. 6E, the resist patterns 51 are removed. After that, as illustrated in FIG. 6F, a plating film 55 is formed so as to cover the exposed surfaces of the seed layer 53 and the plating film 54. The plating film 55 may be formed by forming a Ni film by electroless plating, and subsequently forming an Au film by electroless plating, for example. In this way, a mounting adapter 10 is manufactured.

Figure 7A:
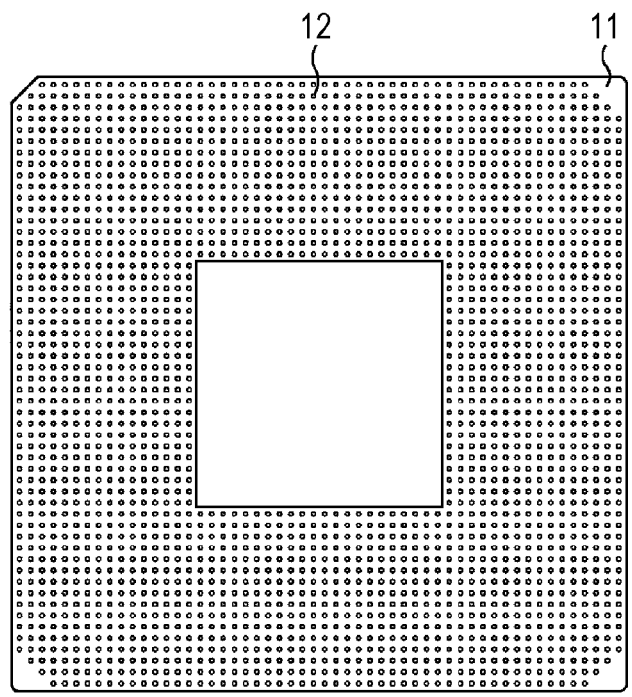
FIGS. 7A and 7B illustrate exemplary layouts of component-side electrodes and socket-side electrodes, respectively.
Figure 7B:
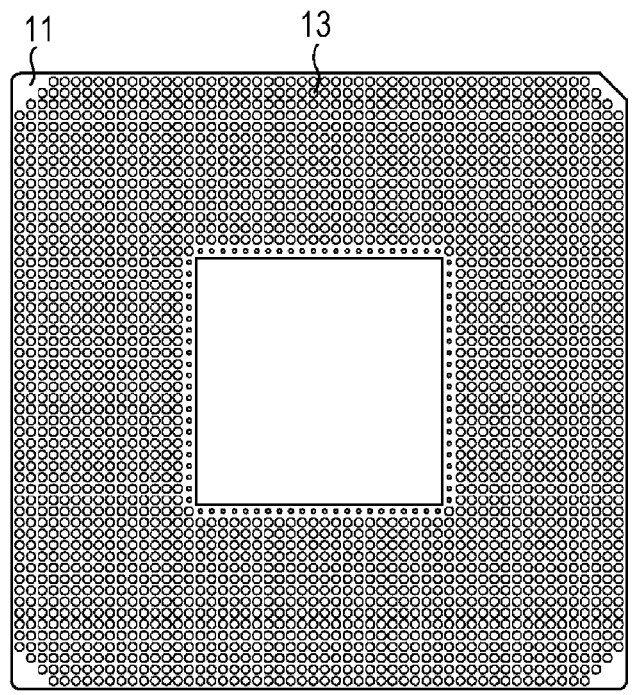

It is to be noted that the layouts of the component-side electrodes 12 and the socket-side electrodes 13 may be determined in accordance with the layout of the pads 22 of the electronic component 20. FIGS. 7A and 7B illustrate exemplary layouts of the component-side electrodes 12 and the socket-side electrodes 13, respectively.

Figure 8A:
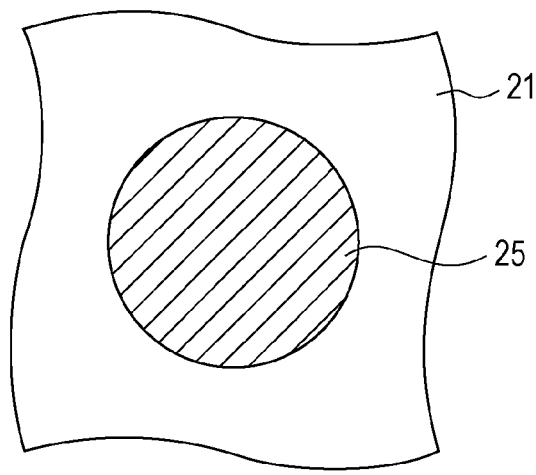
FIGS. 8A through 8C illustrate an alignment method.
Figure 8B:
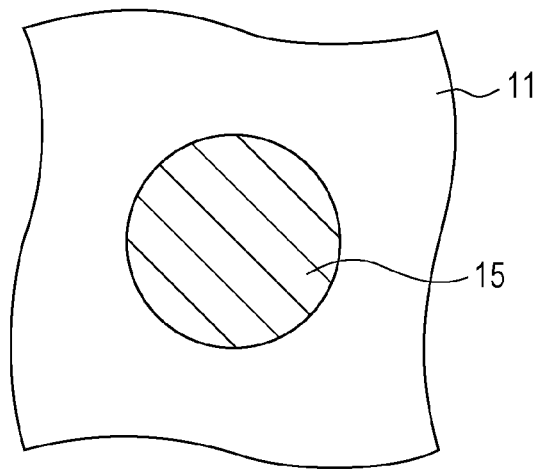
Figure 8C:
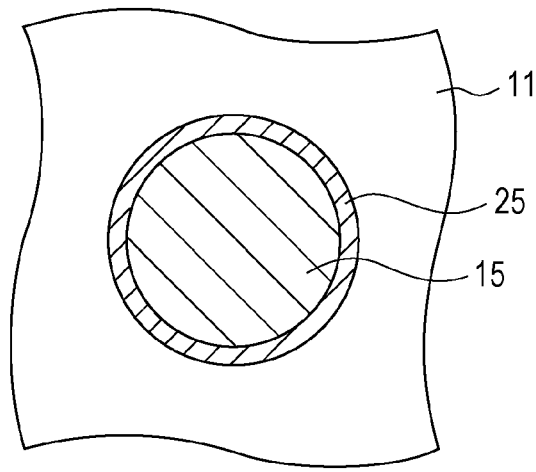

A dummy pattern serving as an alignment pattern may preferably be provided on each of the mounting adapter 10 and the electronic component 20. For instance, a circular dummy pattern 25 is formed on the base 21 as illustrated in FIG. 8A, and a dummy pattern 15 that is smaller than the dummy pattern 25 is formed on the base 11 as illustrated in FIG. 8B. The base 11 may be made of a material, such as polyimide, that transmits visible light such that the position of the dummy pattern 25 may be seen through the base 11. Thus, it is possible to perform alignment with high accuracy on the basis of the positional relationship between the dummy pattern 25 and the dummy pattern 15. For example, as illustrated in FIG. 8C, the alignment may be performed such that the dummy pattern 25 and the dummy pattern 15 are concentrically arranged. It is to be noted that the dummy pattern 25 may be formed in the same manner as the pad 22, and the dummy pattern 15 may be formed in the same manner as the component-side electrode 12 and the socket-side electrode 13.

Figure 9A:
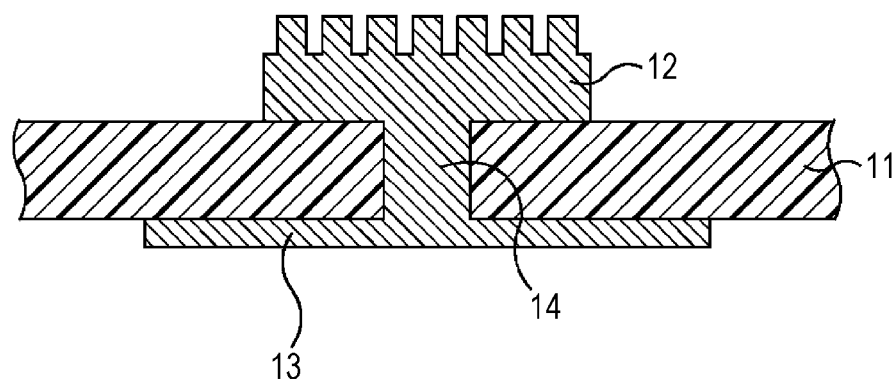
FIGS. 9A and 9B illustrate examples of the shape of the component-side electrode.
Figure 9B:
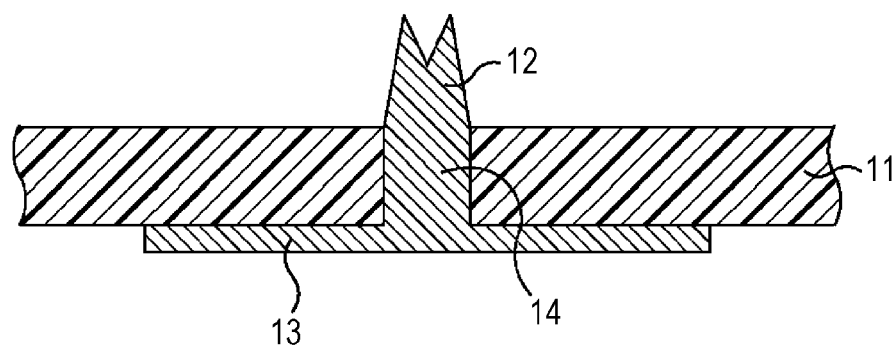

The shape of the component-side electrode 12 is not particularly limited. For instance, the component-side electrode 12 may have the shape illustrated in FIG. 9A or FIG. 9B. More specifically, alternating projections and recesses having a square wave shape may be formed on the surface of the component-side electrode 12 as illustrated in FIG. 9A. Alternatively, the component-side electrode 12 may have pointed ends as illustrated in FIG. 9B. In particular, in the case where the component-side electrode 12 has the shape illustrated in FIG. 9B, even if an insulating film such as a native oxide film is present on the surface of the pad 22, the component-side electrode 12 may cut through the insulating film.

Figure 10A:
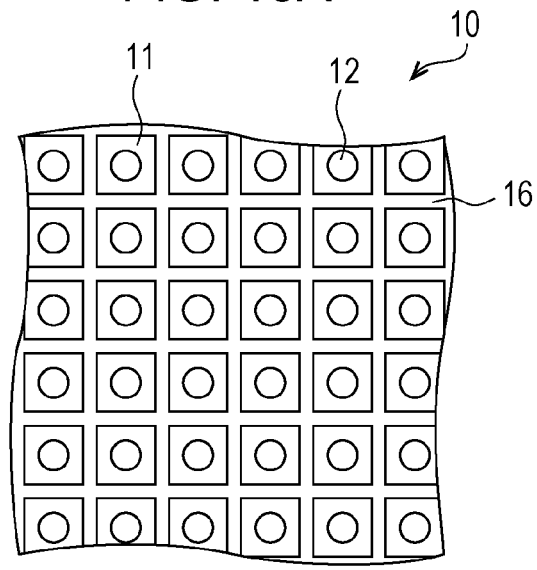
FIGS. 10A and 10B illustrate slits and thin portions.
Figure 10B:
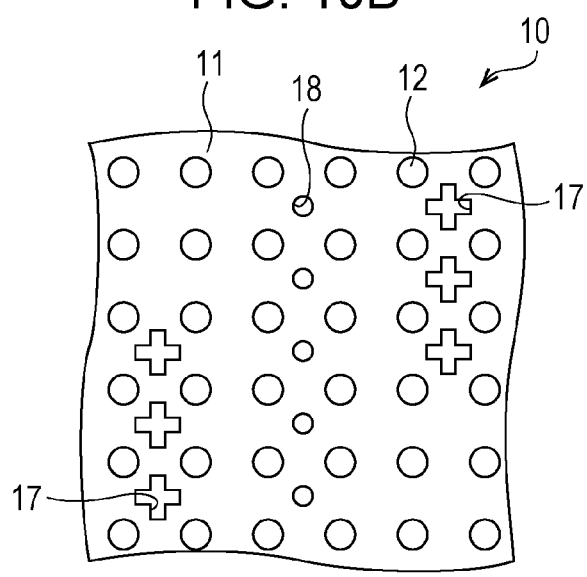

As illustrated in FIG. 10A, slits 16 may preferably be formed in the base 11. Since the thickness of the base 11 is less at the portions where the slits 16 are formed, the flexibility thereof is increased. As the flexibility increases, the base 11 is more likely to conform to the shape of the electronic component 20. Therefore, even if the thickness of the resist material 23 of the electronic component 20 is not uniform, it is possible to more reliably bring the component-side electrodes 12 into contact with the pads 22. It is to be noted that, in place of the slits 16 of FIG. 10A extending in horizontal and vertical directions, thin portions 17 having a cross shape or thin portions 18 having a circular shape illustrated in FIG. 10B may be formed. The slits 16 may be provided together with the thin portions 17 and/or the thin portions 18. Alternatively, only one of the thin portions 17 or the thin portions 18 may be formed. In any case, it is preferable to provide a portion that is thinner than the portion interposed between the component-side electrode 12 and the socket-side electrode 13. The positions of the slits 16 and the thin portions 17 and 18 are not particularly limited.

In order to obtain good flexibility, the area of the through via 14 may preferably be less than the area of the component-side electrode 12, and the area of the through via 14 may preferably be less than the area of the socket-side electrode 13 in plan view. Further, the area of the component-side electrode 12 is less than the area of the socket-side electrode 13.

Figure 11A:
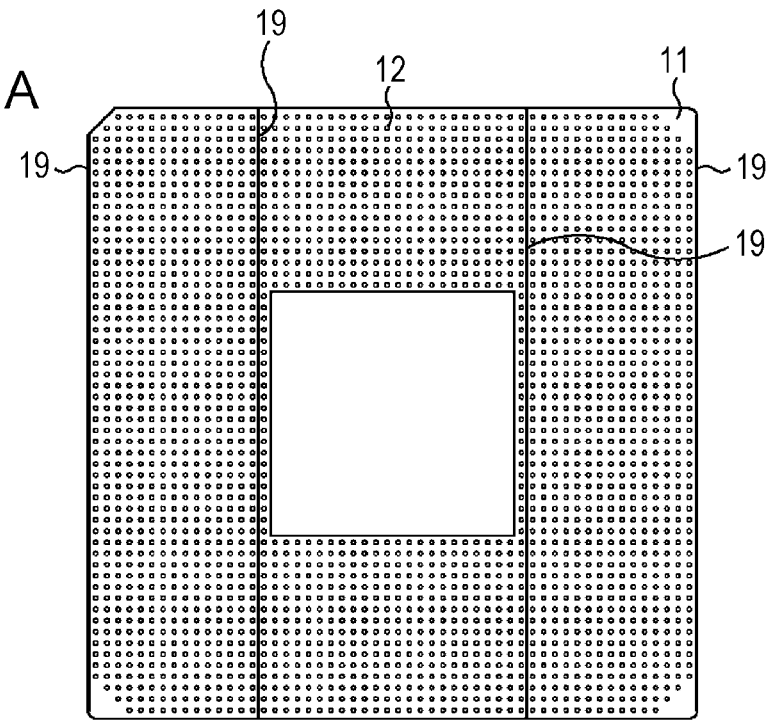
FIGS. 11A and 11B illustrate the positions to which adhesive is applied.
Figure 11B:
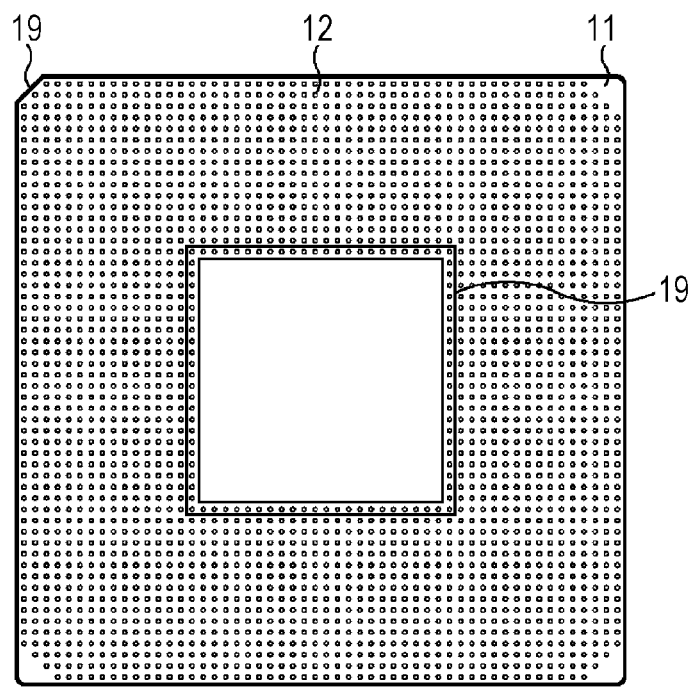

As mentioned above, upon mounting the electronic component 20 onto the mounting board 40, the mounding adapter 10 is attached to the electronic component 20, for example. For attaching the electronic component 20 onto the mounting board 40, adhesive agent 19 is applied to a surface of the base 11 on which the component-side electrode 12 is formed as illustrated in FIG. 11A or 11B, for example. The region to which the adhesive agent 19 is applied is not particularly limited. For example, the adhesive agent 19 may be applied to form four parallel straight lines as illustrated in FIG. 11A, or may be applied along the inner periphery and the outer periphery as illustrated in FIG. 11B.

Figure 12A:
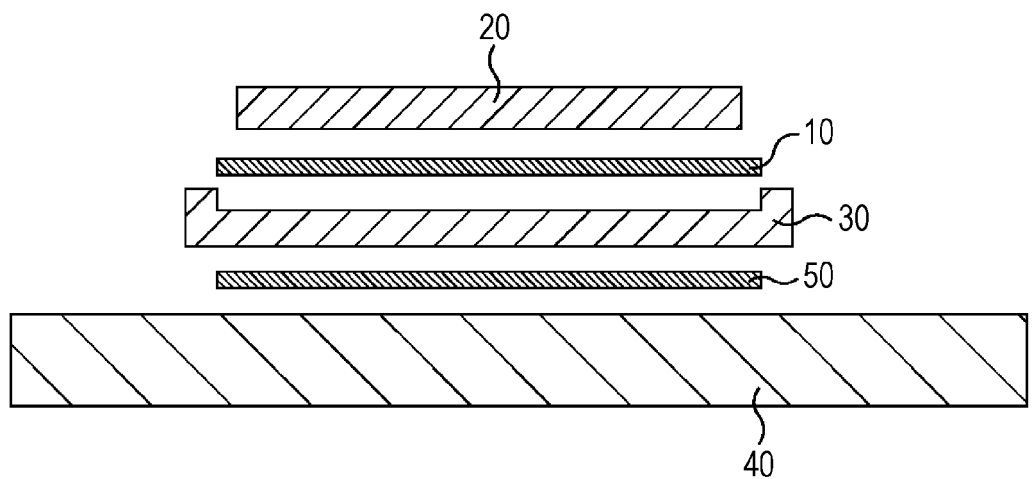
FIGS. 12A and 12B illustrate a variation of the embodiment.
Figure 12B:
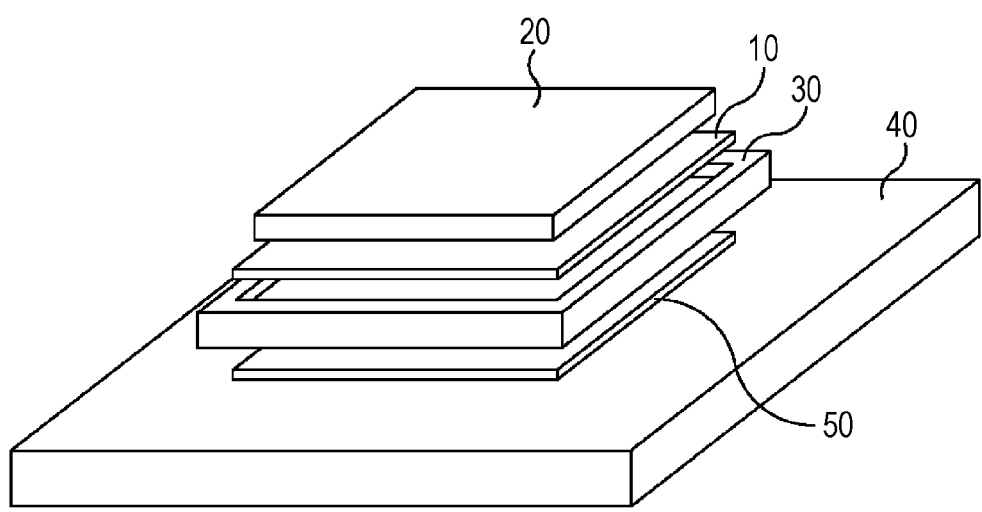

Further, as illustrated in FIGS. 12A and 12B, a mounting adapter 50 that is designed with the same concept as the mounting adapter 10 may be provided between the socket 30 and the mounting board 40 so as to electrically connect the conductive films 33 of the socket 30 to pads of the mounting board 40.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A mounting adapter to be disposed between a socket and an electronic component when the electronic component is mounted with the socket, the mounting adapter comprising:
   a base having insulating property;
   a first electrode provided on a first surface of the base, the first surface facing the electronic component, the first electrode being in contact with an electric pad of the electronic component;
   a second electrode provided on a second surface of the base, the second surface facing the socket, the second electrode being in contact with a conductor of the socket; and
   a through via that penetrates through the base and electrically connects the first electrode and the second electrode,
   wherein the conductor comprises a deformable conductive film mounted on an elastic body of the socket.

2. The mounting adapter according to claim 1, wherein the base is made of organic resin.

3. The mounting adapter according to claim 1, wherein an area of the through via is less than an area of the first electrode in plan view.

4. The mounting adapter according to claim 1, wherein the area of the through via is less than an area of the second electrode in plan view.

5. The mounting adapter according to claim 1, wherein the area of the first electrode is less than the area of the second electrode in plan view.

6. The mounting adapter according to claim 1, wherein the first electrode is thicker than the second electrode.

7. The mounting adapter according to claim 1, wherein the base is flexible.

8. The mounting adapter according to claim 1, wherein the base has a portion that is thinner than a portion thereof disposed between the first electrode and the second electrode.

9. The mounting adapter according to claim 1, wherein the first electrode has a thickness greater than a level difference between the pad of the electronic component and a resist material covering the pad.

10. The mounting adapter according to claim 1, wherein the base transmits visible light.

11. A printed board comprising:
    a mounting board;
    an electronic component that is mounted on the mounting board with a socket interposed therebetween; and a mounting adapter disposed between the socket and the electronic component, the mounting adapter including, a base having insulating property;

a first electrode provided on a first surface of the base, the first surface facing the electronic component, the first electrode being in contact with an electric pad of the electronic component;

a second electrode provided on a second surface of the base, the second surface facing the socket, the second electrode being in contact with a conductor of the socket; and a through via that penetrates through the base and electrically connects the first electrode and the second electrode, wherein the conductor comprises a deformable conductive film mounted on an elastic body of the socket.

12. The printed board according to claim 11, wherein the electronic component is a ball grid array packaged component.

13. The printed board according to claim 11, wherein the electronic component includes a base made of an organic material.

14. A method of manufacturing a printed board comprising:

attaching a mounting adapter to an electronic component such that a first electrode of the mounting adapter faces an electric pad of the electronic component; the mounting adaptor including, a base having insulating property;

the first electrode provided on a first surface of the base, the first surface facing the electronic component, the first electrode being in contact with the electric pad of the electronic component;

a second electrode provided on a second surface of the base, the second surface facing a socket, the second electrode being in contact with a conductor of the socket; and a through via that penetrates through the base and electrically connects the first electrode and the second electrode; and mounting the electronic component onto a mounting board with a socket interposed therebetween while bringing the second electrode into contact with a conductor of the socket, wherein the conductor comprises a deformable conductive film mounted on an elastic body of the socket.

15. The method of manufacturing a printed board according to claim 14, wherein the attaching includes performing alignment using an alignment pattern provided on the mounting adapter and an alignment pattern provided on the electronic component.

* * * * *